(12) United States Patent
Wang (10) Patent No.: US 11,749,153 B1
(45) Date of Patent: Sep. 5, 2023

(54) DISPLAY DEVICE, DETECTION METHOD FOR AMBIENT LIGHT, ELECTRONIC DEVICE AND STORAGE MEDIUM

(71) Applicant: BEIJING XIAOMI MOBILE SOFTWARE CO., LTD., Beijing (CN)

(72) Inventor: Zhongbo Wang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 18/089,552

(22) Filed: Dec. 27, 2022

(30) Foreign Application Priority Data

Sep. 20, 2022 (CN) .......................... 202211146414.6

(51) Int. Cl.
| | |
|---|---|
| G09G 3/00 | (2006.01) |
| G09G 3/32 | (2016.01) |
| H10K 59/13 | (2023.01) |
| H10K 77/10 | (2023.01) |
| H10K 102/00 | (2023.01) |

(52) U.S. Cl.
CPC .............. G09G 3/035 (2020.08); G09G 3/32 (2013.01); H10K 59/13 (2023.02); H10K 77/111 (2023.02); G09G 2320/0626 (2013.01); G09G 2360/144 (2013.01); H10K 2102/311 (2023.02)

(58) Field of Classification Search
CPC .. G09G 3/035; G09G 3/32; G09G 2320/0626; G09G 2360/144; G09G 3/30; G09G 5/10; G09G 3/3406; H10K 59/13; H10K 77/111; H10K 2102/311; G06F 1/1681; G06F 3/0416; G06F 1/1618; G09F 9/30; H04M 1/0268

See application file for complete search history.

(56) References Cited

U.S. PATENT DOCUMENTS

| | | | | |
|---|---|---|---|---|
| 2018/0204524 A1* | 7/2018 | Kucera | .................... | G09G 3/30 |
| 2019/0189042 A1* | 6/2019 | Aurongzeb | ........... | G06F 1/1681 |
| 2021/0225982 A1 | 7/2021 | Yi | | |
| 2021/0318777 A1* | 10/2021 | Mao | ...................... | G06F 3/0416 |
| 2022/0101767 A1* | 3/2022 | Wu | ...................... | G06F 1/1618 |
| 2022/0214852 A1* | 7/2022 | Kim | ........................ | G09F 9/30 |

(Continued)

FOREIGN PATENT DOCUMENTS

| | | | | |
|---|---|---|---|---|
| CN | 108848265 A | | 11/2018 | |
| CN | 111854646 A | * | 10/2020 | ............. G01B 11/26 |
| CN | 112905135 A | | 6/2021 | |

OTHER PUBLICATIONS

Extended European Search Report of EP Application No. 22216964.1 dated Mar. 22, 2023, (39p).

*Primary Examiner* — Richard J Hong
(74) *Attorney, Agent, or Firm* — Arch & Lake LLP (57) ABSTRACT

A display device includes: a display screen including a display screen body and a display screen edge part, at least one edge of the display screen being bent toward a back side of the display screen to form the display screen body and the display screen edge part; a first light sensor arranged on a back side of the display screen body and configured to detect a brightness of ambient light of a front side of the display screen body; a light source arranged on a front side of the display screen edge part and configured to emit light according to a preset brightness; and a second light sensor arranged on a back side of the display screen edge part and configured to detect a brightness of the light source.

20 Claims, 2 Drawing Sheets

(56) References Cited

U.S. PATENT DOCUMENTS

| | | | | |
|---|---|---|---|---|
| 2022/0223115 A1* | 7/2022 | Kim | ............... | G09G 3/3406 |
| 2022/0351704 A1* | 11/2022 | Yung | ............... | G09G 5/10 |
| 2023/0141559 A1* | 5/2023 | Kim | ............... | H04M 1/0268 |
| | | | | 361/679.56 |

* cited by examiner

DISPLAY DEVICE, DETECTION METHOD FOR AMBIENT LIGHT, ELECTRONIC DEVICE AND STORAGE MEDIUM

CROSS-REFERENCE TO RELATED APPLICATION

This application is based upon and claims priority to Chinese Patent Application No. 202211146414.6, filed on Sep. 20, 2022, the entire content of which is incorporated herein by reference for all purposes.

BACKGROUND

At present, with the popularization of intelligent terminal devices, users' pursuit of a display image of the terminal device is continuously improving. At present, the terminal device can detect an intensity of ambient light through a light sensor and adjust a brightness of a display image according to the intensity of ambient light, so that a user can watch the display image with relieved eye fatigue. However, in the existing terminal devices, the light sensor is disposed below the screen, and a light transmittance of the screen changes with the aging of the screen, so ambient brightness information acquired by the light sensor also changes, which is not conducive to the brightness adjustment of the display image.

SUMMARY

The present disclosure relates to the field of optics, and especially to a display device, a detection method and apparatus for ambient light, an electronic device, and a storage medium.

According to a first aspect of the present disclosure, there is provided a display device. The display device includes: a display screen, an edge of the display screen in at least one direction being bent toward a back side of the display screen to form a display screen body and a display screen edge part; a first light sensor arranged at a back side of the display screen body and configured to detect a brightness of ambient light of a front side of the display screen body; a light source arranged at a front side of the display screen edge part and configured to emit light according to a preset brightness; and a second light sensor arranged at a back side of the display screen edge part and configured to detect a brightness of the light source.

According to a second aspect of the present disclosure, there is provided a terminal device including the above-mentioned display device.

According to a third aspect of the present disclosure, there is provided a detection method for ambient light, which is applied to the terminal device and includes: acquiring first brightness information of current ambient light collected by the first light sensor; acquiring second brightness information of the light source collected by the second light sensor; and determining target brightness information of the current ambient light according to the first brightness information, the second brightness information and a preset brightness of the light source.

It is to be understood that both the foregoing general description and the following detailed description are illustrative and explanatory only and are not restrictive of the present disclosure, as claimed.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to illustrative embodiments, examples of which are illustrated in the accompanying drawings. The following description refers to the accompanying drawings in which the same numbers in different drawings represent the same or similar elements unless otherwise represented. The implementations set forth in the following description of illustrative embodiments do not represent all implementations consistent with the present disclosure. Instead, they are merely examples of apparatuses and methods consistent with aspects related to the present disclosure as recited in the appended claims.

Terms used in the present disclosure are only for the purpose of describing specific embodiments, but should not be construed to limit the present disclosure. As used in the present disclosure and the appended claims, "a/an", "said" and "the" in singular forms are intended to include plural forms, unless clearly indicated in the context otherwise. It should also be understood that, the term "and/or" used herein represents and cover any one or all possible combinations of one or more associated listed items.

It should be understood that, although terms such as "first," "second" and "third" may be used in the present disclosure for describing various information, these information should not be limited by these terms. These terms are only used for distinguishing information of the same type from each other. For example, first information may also be referred to as second information, and similarly, second information may also be referred to as first information, without departing from the scope of the present disclosure. As used herein, the term "if" may be construed to mean "when" or "upon" or "in response to determining", depending on the context.

The terms "module," "sub-module," "circuit," "sub-circuit," "circuitry," "sub-circuitry," "unit," or "sub-unit" may include memory (shared, dedicated, or group) that stores code or instructions that can be executed by one or more processors. A module may include one or more circuits with or without stored code or instructions. The module or circuit may include one or more components that are directly or indirectly connected. These components may or may not be physically attached to, or located adjacent to, one another.

A unit or module may be implemented purely by software, purely by hardware, or by a combination of hardware and software. In a pure software implementation, for example, the unit or module may include functionally related code blocks or software components, that are directly or indirectly linked together, so as to perform a particular function.

According to a first aspect of embodiments of the present disclosure, there is provided a display device. The display device includes: a display screen, an edge of the display screen in at least one direction being bent toward a back side of the display screen to form a display screen body and a display screen edge part; a first light sensor arranged at a back side of the display screen body and configured to detect a brightness of ambient light of a front side of the display screen body; a light source arranged at a front side of the display screen edge part and configured to emit light according to a preset brightness; and a second light sensor arranged at a back side of the display screen edge part and configured to detect a brightness of the light source.

In combination with any embodiment of the present disclosure, the display device further includes a flat cable and a driving chip arranged at the front side of the display screen edge part.

In combination with any embodiment of the present disclosure, the driving chip is a display driver integrated circuit (DDIC).

In combination with any embodiment of the present disclosure, the display screen is an organic light emitting diode (OLED) screen encapsulated by a chip on pi (COP) process.

In combination with any embodiment of the present disclosure, the display screen edge part is disposed under the display screen body.

In combination with any embodiment of the present disclosure, the back side of the display screen body is arranged opposite to a main body of the display screen edge part.

According to a second aspect of embodiments of the present disclosure, there is provided a terminal device including the above-mentioned display device.

According to a third aspect of embodiments of the present disclosure, there is provided a detection method for ambient light, which is applied to the terminal device and includes: acquiring first brightness information of current ambient light collected by the first light sensor; acquiring second brightness information of the light source collected by the second light sensor; and determining target brightness information of the current ambient light according to the first brightness information, the second brightness information and a preset brightness of the light source.

In combination with any embodiment of the present disclosure, determining the target brightness information of the current ambient light according to the first brightness information, the second brightness information and the preset brightness of the light source includes: determining a light transmittance of the display screen according to the second brightness information and the preset brightness of the light source; and determining the target brightness information of the current ambient light according to the first brightness information and the light transmittance of the display screen.

In combination with any embodiment of the present disclosure, before acquiring the first brightness information of the current ambient light collected by the first light sensor, the method further includes turning on the light source in response to the display screen being turned off.

In combination with any embodiment of the present disclosure, the method further includes controlling a brightness of a display image of the display screen according to the target brightness information.

In combination with any embodiment of the present disclosure, controlling the brightness of the display image of the display screen according to the target brightness information includes determining the brightness of the display image of the display screen according to the target brightness information and a mapping relationship, and the mapping relationship represents a correspondence between brightness information of the ambient light and a brightness of the display screen.

According to a fourth aspect of embodiments of the present disclosure, there is provided a detection apparatus for ambient light, which is applied to the terminal device, and the apparatus includes: a first acquiring module configured to acquire first brightness information of current ambient light collected by the first light sensor; a second acquiring module configured to acquire second brightness information of the light source collected by the second light sensor; and a brightness determining module configured to determine target brightness information of the current ambient light according to the first brightness information, the second brightness information and a preset brightness of the light source.

In combination with any embodiment of the present disclosure, the brightness determining module is specifically configured to determine a light transmittance of the display screen according to the second brightness information and the preset brightness of the light source; and determine the target brightness information of the current ambient light according to the first brightness information and the light transmittance of the display screen.

In combination with any embodiment of the present disclosure, the apparatus further includes a light source starting module, which is configured to turn on the light source in response to the display screen being turned off.

In combination with any embodiment of the present disclosure, the apparatus further includes a brightness controlling module, which is configured to control a brightness of a display image of the display screen according to the target brightness information.

In combination with any embodiment of the present disclosure, the brightness controlling module is specifically configured to determine the brightness of the display image of the display screen according to the target brightness information and a mapping relationship, and the mapping relationship represents a correspondence between brightness information of the ambient light and a brightness of the display screen.

According to a fifth aspect of embodiments of the present disclosure, there is provided an electronic device, which includes: a processor; and a memory configured to store instructions executable by the processor, and the processor is configured to execute the executable instructions in the memory to implement steps of the method according to any embodiment of the first aspect.

According to a sixth aspect of embodiments of the present disclosure, there is provided a computer-readable storage medium having stored therein computer programs that, when executed by a processor, causes the processor to implement steps of the method according to any embodiment of the first aspect.

The technical solutions provided by embodiments of the present disclosed has the following beneficial effects.

The light transmittance of the terminal device is corrected in time through the second brightness information collected by the second light sensor and the preset brightness of the light source, so that the terminal device can obtain more accurate target brightness information, and the collection accuracy of the terminal device for ambient light is less affected by screen aging. With the technical solutions according to embodiments of the present disclosure, a light transmittance calibrating step can be omitted in the production process, thereby reducing the production cost.

Figure 1:
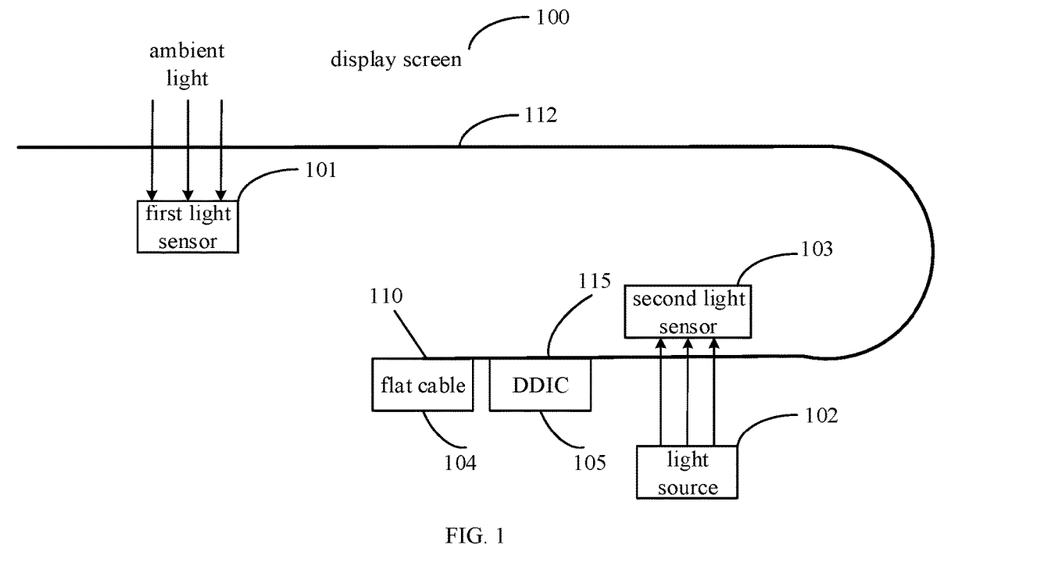
FIG. 1 is a schematic diagram showing a display device according to one or more examples of the present disclosure.

FIG. 1 shows a schematic diagram of a display device according to an illustrative embodiment of the present disclosure.

As shown in FIG. 1, the display device specifically includes a display screen 100, a first light sensor 101, a light source 102, and a second light sensor 103.

An edge 110 of the display screen 100 in at least one direction is bent toward a back side of the display screen to form a display screen body 112 and a display screen edge part 115.

Optionally, the display screen 100 may be encapsulated by a plastic substrate flip chip on pi (COP) process and other encapsulation process. For example, an edge of a flexible organic light emitting diode (OLED) screen, such as an active matrix organic light emitting diode (AMOLED) screen, is bent toward a back side of the screen to form a borderless visual effect, an unbent part of the screen constitutes the display screen body, and a bent part of the screen constitutes the display screen edge part. In an example, left and right long edges of the display screen may be bent toward the back side of the display screen. It should be understood that other bending modes are also available, which is not specifically limited in the present disclosure.

The first light sensor 101 is arranged at a back side of the display screen body and is configured to detect a brightness of ambient light of a front side of the display screen body.

Optionally, the first light sensor represents an acquiring component provided with a photosensitive element, and is arranged at the back side of the display screen body for acquiring brightness information of ambient light after it passes through the display screen body. In an example, the display device further includes a flat cable 104 and a driving chip 105, which are arranged at a front side of the display screen edge part, and configured to control the display screen 100 to perform a display operation. In an example, the driving chip 105 is a display driver integrated circuit (DDIC).

The light source 102 is arranged at the front side of the display screen edge part and configured to emit light according to a preset brightness.

The second light sensor 103 is arranged at a back side of the display screen edge part and configured to detect a brightness of the light source.

Optionally, the light source 102 and the second light sensor 103 are arranged at a front side and a back side of a bending area of the display screen 100, respectively, and the second light sensor 103 is configured to detect the brightness of the light source. Due to a light transmittance of the display screen 100, the brightness of the light source 102 detected by the second light sensor 103 is different from a true brightness of the light source 102, based on such a difference, a current light transmittance of the display screen can be determined, so that the brightness of the ambient light collected by the first light sensor 101 can be adjusted. In an example, the display screen edge part is disposed under the display screen body. In an example, the back side of the display screen body is arranged opposite to a main body of the display screen edge part, so that the light source 102 and the second light sensor 103 are directly arranged opposite to each other, thus improving the accuracy of brightness detection.

Based on a structure of the display device provided by the present disclosure, the second light sensor can timely collect the brightness information of the light source, and the light transmittance of the display screen can be determined according to the preset brightness of the light source and be updated timely.

Figure 2:
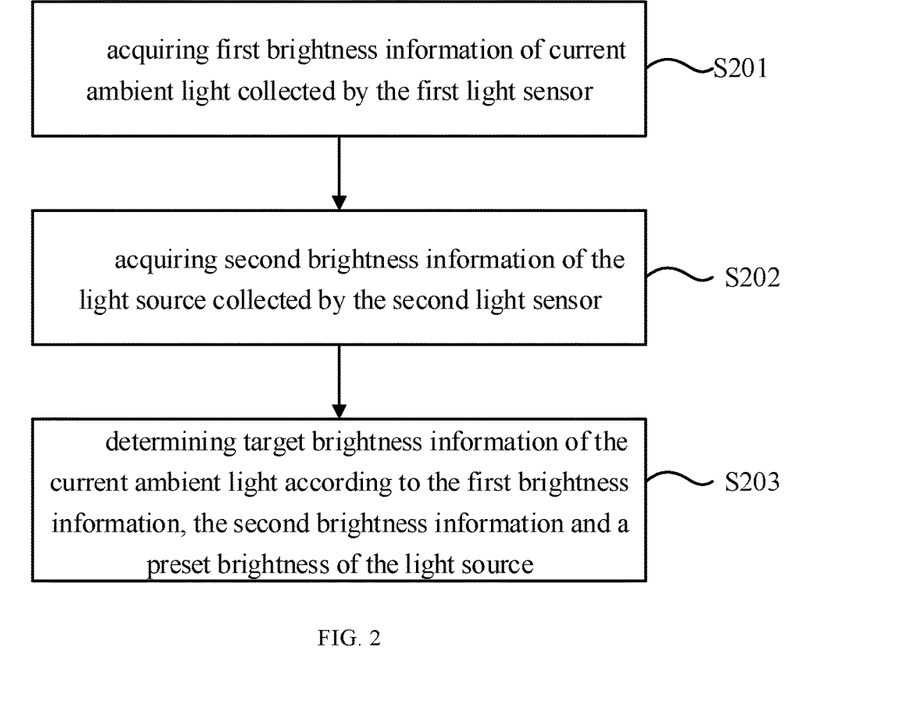
FIG. 2 is a schematic flowchart showing a detection method for ambient light according to one or more examples of the present disclosure.

FIG. 2 shows a schematic flowchart of a detection method for ambient light according to an illustrative embodiment of the present disclosure. The method is applied to a terminal device provided with the above-mentioned display device, and specifically includes steps S201 to S203.

In the step S201, first brightness information of current ambient light collected by the first light sensor is acquired.

Optionally, the first brightness information of a current ambient where the terminal device is located is collected by the first light sensor in the display device, and the first brightness information represents a brightness value of light received by the first light sensor, i.e., a brightness value of the ambient light after passing through the display screen.

Generally, a preset light transmittance of the display screen is stored in the terminal device, and brightness information of the current ambient light can be determined according to the preset light transmittance and the first brightness information. In an example, actual brightness information of the current ambient light can be determined by formula (1):

$$A' = B/\beta' \quad (1),$$

where A' represents the actual brightness information of the current ambient light, B represents the first brightness information, and $\beta'$ represents the light transmittance of the display screen. Generally, $\beta'$ is the preset light transmittance. However, when the light transmittance changes due to the aging of the screen, the preset light transmittance is inconsistent with the current actual light transmittance, resulting in an inaccurate result of the actual brightness information A' of the ambient light. For this, the current actual light transmittance may be determined by the following steps.

In step S202, second brightness information of the light source collected by the second light sensor is acquired.

Optionally, the second brightness information of the light source is collected by the second light sensor in the display device. As the second light sensor and the light source are arranged at both sides of the display screen, respectively, the second light sensor can receive light transmitted through the display screen from the light source, and the second brightness information represents a brightness value of the light received by the second light sensor, i.e., a brightness value of the light of the light source after passing through the display screen.

In step S203, target brightness information of the current ambient light is determined according to the first brightness information, the second brightness information and a preset brightness of the light source.

Firstly, since the preset brightness of the light source is a known quantity, a reduction degree of the preset brightness by the display screen, i.e., the current actual light transmittance of the display screen, can be determined according to the preset brightness and the second brightness information. In an example, a ratio of the second brightness information to the preset brightness value can be used as the light transmittance of the display screen.

After that, true brightness information, i.e., the target brightness information, of the current ambient can be determined based on the light transmittance and the first brightness information. In an example, the target brightness information can be determined by formula (2):

$$A = \frac{B}{\beta}, \quad (2)$$

where A represents the target brightness information, B represents the first brightness information, and β represents the current true light transmittance of the display screen obtained according to the second brightness information and the preset brightness of the light source.

According to the method of the present disclosure, the light transmittance of the terminal device is corrected in time through the second brightness information collected by the second light sensor and the preset brightness of the light source, so that the terminal device can obtain more accurate target brightness information, and the collection accuracy of the terminal device for the ambient light is less affected by screen aging. Further, with the technical solutions according to embodiments of the present disclosure, a light transmittance calibrating step can be omitted in the production process, thereby reducing the production cost.

In an optional embodiment, before acquiring the first brightness information of the current ambient light collected by the first light sensor, the terminal device can also be controlled to turn on the light source after the display screen is turned off, so that the collection of the second brightness information by the second light sensor will not be affected by the brightness of self-illumination of the display screen due to the operation of the display screen. In an example, the light source can be automatically turned on in response to a user turning off the display screen of the terminal device, so as to start the solutions described in the present disclosure.

In another optional embodiment, after determining the target brightness information of the current ambient light, a brightness of a display image of the display screen can be controlled according to the target brightness information.

Specifically, the brightness of the display image of the display screen can be determined according to brightness information of the ambient light and a mapping relationship. For example, a corresponding mapping relationship table between different brightness information intervals of the ambient light and brightness intervals of the display image of the display screen may be established in advance, or a function curve may be established between the brightness information of the ambient light and the brightness of the display image of the display screen. A specific brightness value of the current display image is determined according to the target brightness information of the current ambient light, so that the brightness of the display image of the display screen increases with the increase of the brightness of the ambient light and decreases with the decrease of the brightness of the ambient light, so that a user can watch the display image more conveniently with relieved eye fatigue.

For the sake of brief description, the foregoing method embodiments are expressed as combinations of a series of actions, but those skilled in the art should be understood that the present disclosure is not limited by the described action sequence, as some steps can be performed in other sequences or simultaneously according to the present disclosure.

Also, those skilled in the art should be understood that the embodiments described in the specification are optional embodiments, and actions and modules involved therein are not necessarily required for the present disclosure.

Corresponding to the foregoing embodiments of the application function implementation method, the present disclosure also provides embodiments of an application function implementation apparatus and a corresponding terminal.

Figure 3:
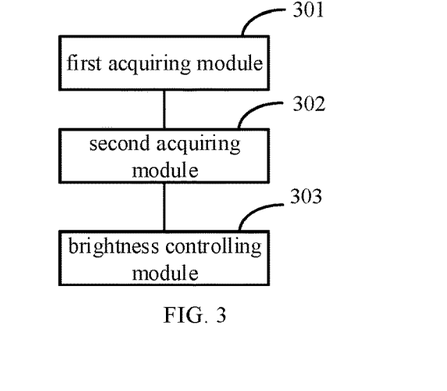
FIG. 3 is a schematic block diagram showing a detection apparatus for ambient light according to one or more examples of the present disclosure.

A schematic block diagram of a detection apparatus for ambient light according to an illustrative embodiment of the present disclosure is shown in FIG. 3. The apparatus is applied to a terminal device, and the apparatus includes a first acquiring module 301, a second acquiring module 302, and a brightness determining module 303.

The first acquiring module 301 is configured to acquire first brightness information of current ambient light collected by a first light sensor.

The second acquiring module 302 is configured to acquire second brightness information of the light source collected by a second light sensor.

The brightness determining module 303 is configured to determine target brightness information of the current ambient light according to the first brightness information, the second brightness information and a preset brightness of the light source.

In combination with any embodiment of the present disclosure, when determining the target brightness information of the current ambient light according to the first brightness information, the second brightness information and the preset brightness of the light source, the brightness determining module is specifically configured to: determine a light transmittance of the display screen according to the second brightness information and the preset brightness of the light source; and determine the target brightness information of the current ambient light according to the first brightness information and the light transmittance of the display screen.

In combination with any embodiment of the present disclosure, before acquiring the first brightness information of the current ambient light collected by the first light sensor, the apparatus further includes a light source starting module, which is configured to turn on the light source in response to the display screen being turned off.

In combination with any embodiment of the present disclosure, after determining the target brightness information of the current ambient light, the apparatus further includes a brightness controlling module, which is configured to control a brightness of a display image of the display screen according to the target brightness information.

In combination with any embodiment of the present disclosure, when controlling the brightness of the display image of the display screen according to the target brightness information, the brightness controlling module is specifically configured to determine the brightness of the display image of the display screen according to the target brightness information and a mapping relationship, and the mapping relationship represents a correspondence between a brightness of the ambient light and a brightness of the display screen.

With respect to the apparatus embodiments, since they basically correspond to the method embodiments, relevant parts can refer to the description of the embodiments of the method. The above-described apparatus embodiments are only illustrative, in which the units described above as separate components may be or may not be physically separated, and components shown as units may be or may not be physical units, that is, they may be located in one place or distributed over a plurality of network units. Some or all of the modules can be selected according to the actual needs to realize the purpose of the present disclosure. These can be understood and implemented by those skilled in the art without creative labor.

Figure 4:
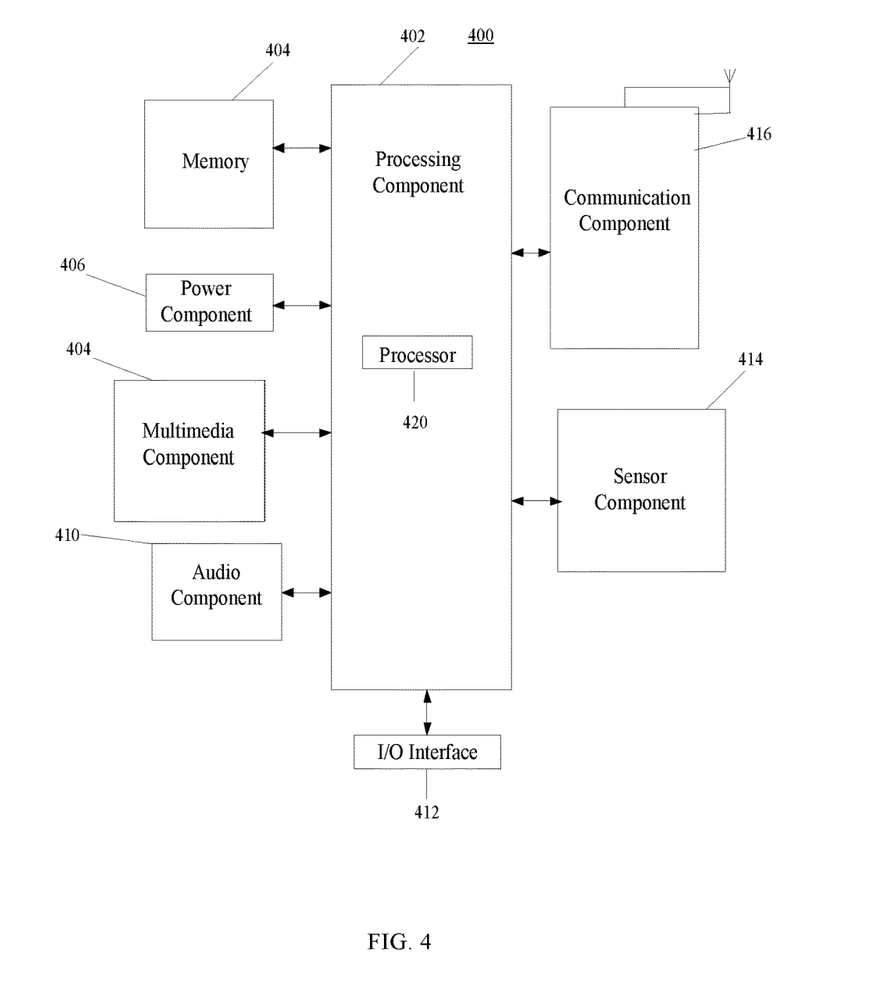
FIG. 4 is a schematic block diagram showing an electronic device according to one or more examples of the present disclosure.

FIG. 4 shows a block diagram of an electronic device according to an illustrative embodiment of the present disclosure.

Reference is made to FIG. 4, which illustratively shows a block diagram of an electronic device. For example, the device 400 may be a mobile phone, a computer, a digital broadcast terminal, a messaging device, a game console, a tablet device, a medical device, a fitness device, a personal digital assistant, or the like.

Referring to FIG. 4, the device 400 may include one or more of the following components: a processing component 402, a memory 404, a power component 406, a multimedia component 408, an audio component 410, an input/output (I/O) interface 412, a sensor component 414, and a communication component 416.

The processing component 402 typically controls overall operations of the device 400, such as the operations associated with display, phone calls, data communications, camera operations, and recording operations. The processing component 402 can include one or more processors 420 to execute instructions to perform all or some of the steps in the above described methods. Moreover, the processing component 402 may include one or more modules which facilitate the interaction between the processing component 402 and other components. For instance, the processing component 402 may include a multimedia module to facilitate the interaction between the multimedia component 408 and the processing component 402.

The memory 404 is configured to store various types of data to support the operation of the device 400. Examples of such data include instructions for any applications or methods operated on the device 400, contact data, phonebook data, messages, pictures, videos, etc. The memory 404 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 406 provides power to various components of the device 400. The power component 406 may include a power management system, one or more power sources, and any other components associated with the generation, management, and distribution of power in the device 400.

The multimedia component 408 includes a screen providing an output interface between the device 400 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensor may not only sense a boundary of a touch or swipe action, but also sense a period of time and a pressure associated with the touch or swipe action. In some embodiments, the multimedia component 408 includes a front camera and/or a rear camera. The front camera and/or the rear camera may receive an external multimedia datum while the device 400 is in an operation mode, such as a photographing mode or a video mode. Each of the front camera and the rear camera may be a fixed optical lens system or have focus and optical zoom capability.

The audio component 410 is configured to output and/or input audio signals. For example, the audio component 410 includes a microphone (MIC) configured to receive an external audio signal when the device 400 is in an operation mode, such as a call mode, a recording mode, and a voice recognition mode. The received audio signal may be further stored in the memory 404 or transmitted via the communication component 416. In some embodiments, the audio component 410 further includes a speaker to output audio signals.

The I/O interface 412 provides an interface between the processing component 402 and peripheral interface modules, such as a keyboard, a click wheel, buttons, and the like. The buttons may include, but are not limited to, a home button, a volume button, a starting button, and a locking button.

The sensor component 414 includes one or more sensors to provide status assessments of various aspects of the device 400. For instance, the sensor component 414 may detect an open/closed status of the device 400, relative positioning of components, e.g., the display and the keypad, of the device 400, a change in position of the device 400 or a component of the device 400, a presence or absence of user contact with the device 400, an orientation or an acceleration/deceleration of the device 400, and a change in temperature of the device 400. The sensor component 414 may include a proximity sensor configured to detect the presence of nearby objects without any physical contact. The sensor component 414 may include a light sensor, such as a CMOS or CCD image sensor, for use in imaging applications. In some embodiments, the sensor component 414 may include an accelerometer sensor, a gyroscope sensor, a magnetic sensor, a pressure sensor, or a temperature sensor.

The communication component 416 is configured to facilitate communication, wired or wireless, between the device 400 and other devices. The device 400 can access a wireless network based on a communication standard, such as WiFi, 2G, 3G, 4G, 5G or a combination thereof. In an illustrative embodiment, the communication component 416 receives a broadcast signal or broadcast associated information from an external broadcast management system via a broadcast channel. In an illustrative embodiment, the communication component 416 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In an illustrative embodiment, the device 400 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the detection method of the above-mentioned electronic devices.

In an illustrative embodiment, there is provided a non-transitory computer readable storage medium including instructions, such as included in the memory 404, executable by the processor 420 in the device 400, for performing the detection method of the above-mentioned electronic devices. For example, the non-transitory computer-readable storage medium may be a ROM, a random access memory (RAM), a CD-ROM, a magnetic tape, a floppy disc, an optical data storage device, and the like.

Other embodiments of the present disclosure will be apparent to those skilled in the art from consideration of the specification and practice of the present disclosure described here. The present disclosure is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

In embodiments of the present disclosure, for COP encapsulation process, only the OLED screen can be used, because in the OLED screen, a base material of ITO may be glass or a bendable plastic. If the base material is a plastic, a part of the base material connecting a flexible printed circuit (FPC) and a driver integrated circuit (IC) can be bent, so that only a width of a dispensing area needs to be reserved. In this case, the border can be thinner.

It should be understood that the term a "front side" of the display screen, the display screen body or the display screen edge part refers to such a side of the display screen, the display screen body or the display screen edge part that is capable of displaying contents, and a "back side" of the display screen, the display screen body or the display screen edge part refers to a side of the display screen, the display screen body or the display screen edge part that is opposite to the side capable of displaying contents.

In the present invention, unless specified or limited otherwise, a structure in which a first feature is "on", "at" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "at," "above," or "on top of" a second feature may include an embodiment in which the first feature is right or obliquely "on," "at," "above," or "on top of" the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

What is claimed is:

1. A display device, comprising:
    a display screen comprising a display screen body and a display screen edge part, at least one edge of the display screen being bent toward a back side of the display screen to form the display screen body and the display screen edge part;
    a first light sensor disposed at a back side of the display screen body and configured to detect a brightness of ambient light of a front side of the display screen body;
    a light source disposed at a front side of the display screen edge part and configured to emit light according to a preset brightness; and
    a second light sensor disposed at a back side of the display screen edge part and configured to detect a brightness of the light source.

2. The display device of claim 1, further comprising a flat cable and a driving chip disposed at the front side of the display screen edge part.

3. The display device of claim 2, wherein the driving chip is a display driver integrated circuit.

4. The display device of claim 1, wherein the display screen is an organic light emitting diode (OLED) screen encapsulated by a chip on pi (COP) process.

5. The display device of claim 1, wherein the display screen edge part is disposed under the display screen body.

6. A terminal device, comprising a display device, the display device comprising:
    a display screen comprising a display screen body and a display screen edge part, at least one edge of the display screen being bent toward a back side of the display screen to form the display screen body and the display screen edge part;
    a first light sensor disposed at a back side of the display screen body and configured to detect a brightness of ambient light of a front side of the display screen body;
    a light source disposed at a front side of the display screen edge part and configured to emit light according to a preset brightness; and
    a second light sensor disposed at a back side of the display screen edge part and configured to detect a brightness of the light source.

7. The terminal device of claim 6, further comprising a flat cable and a display driver integrated circuit disposed at the front side of the display screen edge part.

8. The terminal device of claim 1, wherein the display screen is an organic light emitting diode (OLED) screen encapsulated by a chip on pi (COP) process.

9. The terminal device of claim 6, wherein the back side of the display screen body is disposed opposite to a main body of the display screen edge part.

10. A method for detecting ambient light, applied to a terminal device comprising a display device, the display device comprising:
    a display screen comprising a display screen body and a display screen edge part, at least one edge of the display screen being bent toward a back side of the display screen to form the display screen body and the display screen edge part;
    a first light sensor disposed at a back side of the display screen body and configured to detect a brightness of ambient light of a front side of the display screen body;
    a light source disposed at a front side of the display screen edge part and configured to emit light according to a preset brightness; and
    a second light sensor disposed at a back side of the display screen edge part and configured to detect a brightness of the light source,
    the method comprising:
    acquiring first brightness information of current ambient light collected by the first light sensor;
    acquiring second brightness information of the light source collected by the second light sensor; and
    determining target brightness information of the current ambient light according to the first brightness information, the second brightness information and a preset brightness of the light source.

11. The method of claim 10, wherein determining the target brightness information of the current ambient light according to the first brightness information, the second brightness information and the preset brightness of the light source comprises:
    determining a light transmittance of the display screen according to the second brightness information and the preset brightness of the light source; and
    determining the target brightness information of the current ambient light according to the first brightness information and the light transmittance of the display screen.

12. The method of claim 10, before acquiring the first brightness information of the current ambient light collected by the first light sensor, further comprising:

turning on the light source in response to the display screen being turned off.

13. The method of claim 10, further comprising:

controlling a brightness of a display image of the display screen according to the target brightness information.

14. The method of claim 13, wherein controlling the brightness of the display image of the display screen according to the target brightness information comprises:

determining the brightness of the display image of the display screen according to the target brightness information and a mapping relationship, wherein the mapping relationship represents a correspondence between brightness information of the ambient light and a brightness of the display screen.

15. An electronic device, comprising:

a processor; and a memory configured to store instructions executable by the processor, wherein the processor is configured to execute the executable instructions in the memory to implement steps of the method according to claim 10.

16. An electronic device, comprising:

a processor; and a memory configured to store instructions executable by the processor, wherein the processor is configured to execute the executable instructions in the memory to implement steps of the method according to claim 11.

17. An electronic device, comprising:

a processor; and a memory configured to store instructions executable by the processor, wherein the processor is configured to execute the executable instructions in the memory to implement steps of the method according to claim 12.

18. An electronic device, comprising:

a processor; and a memory configured to store instructions executable by the processor, wherein the processor is configured to execute the executable instructions in the memory to implement steps of the method according to claim 13.

19. An electronic device, comprising:

a processor; and a memory configured to store instructions executable by the processor, wherein the processor is configured to execute the executable instructions in the memory to implement steps of the method according to claim 14.

20. A computer-readable storage medium having stored therein computer programs that, when executed by a processor, causes the processor to implement steps of the method according to claim 10.

* * * * *